United States Patent [19]

Prentice et al.

[11] Patent Number: 4,560,948
[45] Date of Patent: Dec. 24, 1985

[54] CIRCUIT FOR INCREASING VOLTAGE GAIN

[75] Inventors: John S. Prentice, Palm Bay; Gerald M. Cotreau, Melbourne, both of Fla.

[73] Assignee: Harris Corporation, Melbourne, Fla.

[21] Appl. No.: 630,280

[22] Filed: Jul. 12, 1984

[51] Int. Cl.⁴ .......................... H03G 3/30; H03F 1/34
[52] U.S. Cl. ..................................... 330/282; 330/86; 330/293
[58] Field of Search ............... 330/260, 310, 311, 278, 330/282, 85, 80, 293

[56] References Cited

U.S. PATENT DOCUMENTS

| | | | |
|---|---|---|---|
| 3,988,694 | 10/1976 | Yamazaki | 330/278 |
| 4,267,518 | 5/1981 | Davis | 330/278 |
| 4,393,355 | 7/1983 | Davis et al. | 330/294 |

Primary Examiner—James B. Mullins
Assistant Examiner—G. Wan
Attorney, Agent, or Firm—Barnes & Thornburg

[57] ABSTRACT

An operational amplifier having an input stage, a voltage gain stage, a current gain or buffer stage and a feedback connected between the output of the buffer stage for supplying to the voltage gain stage a current which varies in proportion to the voltage gain stage output to increase the output impedance of the voltage gain stage.

18 Claims, 6 Drawing Figures

CIRCUIT FOR INCREASING VOLTAGE GAIN

BACKGROUND AND SUMMARY OF THE INVENTION

The present invention relates generally to operational amplifiers and more particularly to a circuit for increasing the voltage gain of operational amplifiers.

A commonly used operational amplifier has an input stage, a voltage gain stage and a current gain stage. The input stage provides a voltage input to the voltage gain stage, which normally consists of one or more serially connected voltage amplifiers. A well known circuit of this type has a voltage gain stage consisting of two amplifier circuits with each amplifier circuit consisting of an emitter follower transistor driving a common emitter output transistor. This arrangement provides a voltage gain stage which has a high output impedance and a relatively high voltage gain. The output of the last amplifier in the voltage gain stage is usually connected to a current gain stage (often comprising emitter follower transistors) which provides for isolation of the voltage gain stage from output load current variations. Thus, the current gain stage, which has a voltage gain of approximately 1, acts as a buffer for the output of the operational amplifier.

While amplifiers of this type are characterized by a relatively high voltage gain, certain applications call for a voltage gain which is higher than that readily available from a single, commercially produced operational amplifier. Thus, there exists the need for a circuit or technique which provides for increasing the voltage gain of an operational amplifier of the type just described. In the case of a bipolar amplifier of this type, the present invention increases the gain by providing a feedback path for current to flow from an isolated current source to the voltage gain stage. This current reduces the current flowing in the common emitter output transistor of one of the amplifier circuits. This results in an effective increase in the output impedance of the common-emitter circuit, accompanied by a corresponding increase in circuit gain. In the particular embodiment of the invention described below, this is accomplished by the addition of a single component to a known operational amplifier circuit.

Accordingly, an object of the present invention is to provide an improved operational amplifier.

Another object of the present invention is to provide means for increasing the voltage gain of an operational amplifier without adversely affecting other amplifier performance characteristics.

Still another object of the present invention is to provide means for increasing the voltage gain of an operational amplifier by the addition of a minimal number of components.

These and other objects are attained in an operational amplifier which comprises an input stage, a voltage gain stage, a buffer stage and a feedback connection from the buffer stage to the voltage gain stage. The input stage transmits an input voltage signal to the input of the voltage gain stage. This stage has at least one amplifying circuit of the common-emitter type which includes a transistor having a collector connected to a current source, an emitter connected by an impedance to a reference voltage and a base connected to a control voltage responsive to variations in the input voltage. The collector is also connected to the input of a buffer stage having an output which is isolated from, but which tracks the voltage present on the collector. The feedback connection from the output of the buffer stage to the emitter of the amplifying circuit provides a path for current which varies in proportion to output voltage variations and which acts to reduce the collector current flowing in the amplifying device for a given instantaneous input voltage level, effectively increasing the output impedance and gain of the common emitter circuit. The feedback path includes an amplifying device to control the flow of feedback current. This device is preferably a transistor which is matched in characteristics to the transistor in the common-emitter circuit. The base of the matching transistor is connected to a voltage source which is substantially equivalent to the voltage supplied to the base of the amplifer circuit. The amplifier circuit can alternatively be implemented as a common-source circuit when field effect transistors are used. The operation of this circuit is as described above, with the drain, source and gate connections corresponding to the collector, emitter and base connections, respectively.

Other objects, advantages and novel features of the present invention will become apparent from the following detailed description of the invention when considered in conjunction with the accompanying drawings.

DETAILED DESCRIPTION OF THE DRAWINGS

Figure 1:
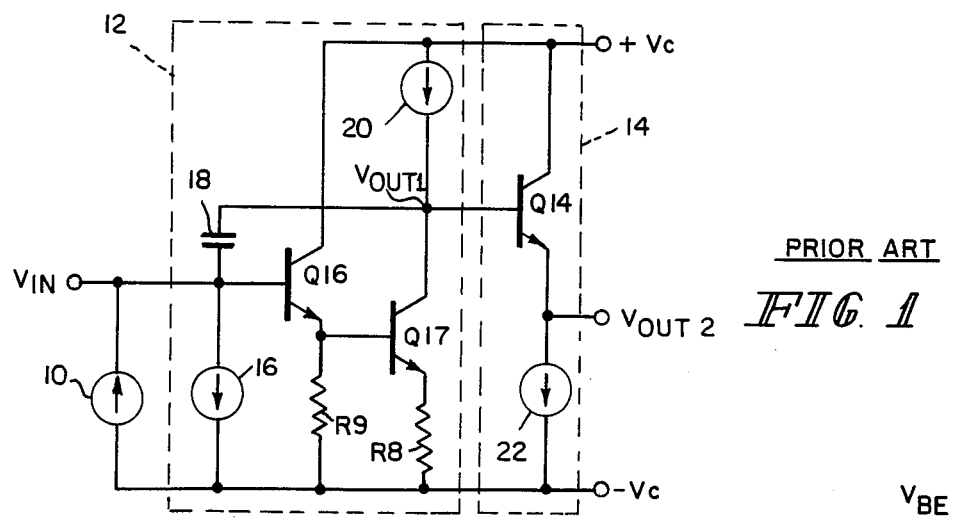
FIG. 1 shows a simplified schematic diagram of a prior art operational amplifier.

FIG. 1 shows a prior art operational amplifier which consists of a voltage input, $V_{IN}$, an input stage represented by current source 10, voltage gain stage 12, current gain stage 14, and voltage output, $V_{OUT2}$. Voltage gain stage 12 includes current sources 16 and 20, transistors $Q_{16}$ and $Q_{17}$, resistors $R_8$ and $R_9$, and capacitor 18 (often referred to as a Miller capacitor). The output of the voltage gain stage, $V_{OUT1}$, is connected to the input of the current gain stage (i.e., the base of transistor $Q_{14}$) which is represented by transistor $Q_{14}$ and current source 22. The amplifier output voltage, $V_{OUT2}$, is slightly less than the output voltage, $V_{OUT1}$, of voltage gain stage 12 and the voltage at $V_{OUT2}$ follows (i.e., tracks) the voltage at $V_{OUT1}$. For purposes of the discussion to follow, these two voltage levels are considered to be equal. Current gain stage 14 (which provides current gain, but no voltage gain), serves to buffer the voltage gain stage from variations in load output current and serves to isolate $V_{OUT1}$ from $V_{OUT2}$.

Figure 2:
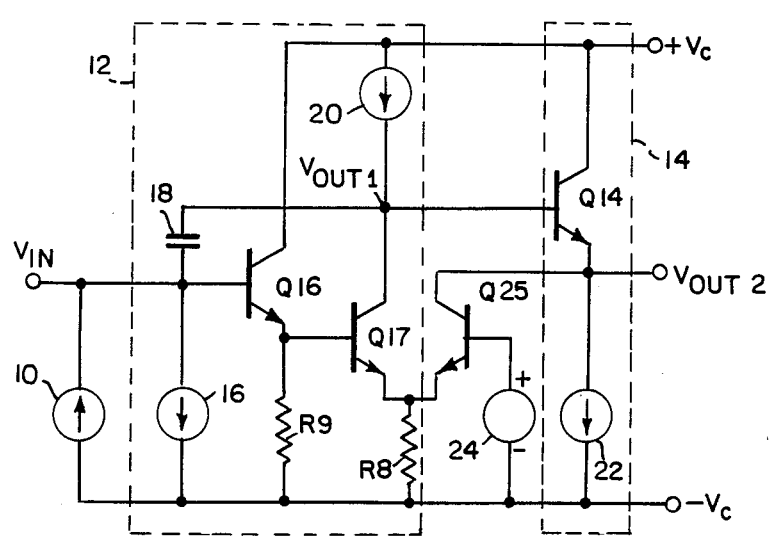
FIG. 2 shows the operational amplifier of FIG. 1 modified in accordance with the present invention.

FIG. 2 shows the circuit of FIG. 1 modified in accordance with the present invention. The modification comprises the addition of transistor $Q_{25}$ having a collector tied to $V_{OUT2}$, an emitter tied to the emitter of $Q_{17}$, and a base tied to voltage source 24. Transistors $Q_{17}$ and $Q_{25}$ are preferably a matched pair (i.e., have substantially identical characteristics). Voltage source 24 is a relatively low impedance source which has a nominal DC voltage selected to be approximately equivalent to the voltage supplied to the base of $Q_{17}$.

Figure 3:
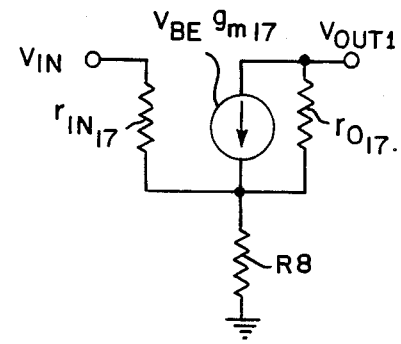
FIG. 3 shows the approximate hybrid-pi equivalent circuit for the voltage gain stage output transistor in the circuit of FIG. 1.

Approximate hybrid-pi equivalent circuits will be used to describe the effects of this modification. FIG. 3 shows the small signal, approximate hybrid-pi equivalent circuit of transistor $Q_{17}$ and resistor $R_8$ as connected in the circuit shown in FIG. 1. The stage transconductance $G_M$ (the output current divided by the input voltage when the output voltage is zero) and the output impedance $R_O$ (the output voltage divided by the output current when the input voltage is zero) can be calculated from the following expressions:

$$G_M = \frac{-g_{m17}}{1 + g_{m17}R_8}$$

$$R_o = r_{o17}(1 + g_{m17}R_8)$$

where, $g_m$ is the device transconductance and $r_{o17}$ is the equivalent resistance between the collector and emitter. The product of these terms is the stage voltage gain $A_v$ which, when the substitutions are made, can be expressed as follows:

$$A_v = -g_{m17}r_{o17}$$

Figure 4:
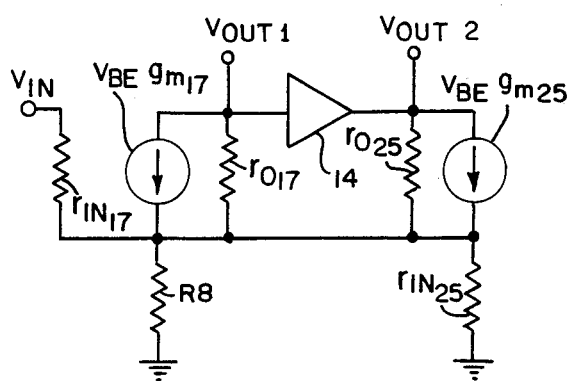
FIG. 4 shows the approximate hybrid-pi equivalent circuit for the portion of the modified amplifier circuit shown in FIG. 2, including the voltage gain stage output transistor, the current gain stage, and a feedback transistor in accordance with the present invention.

FIG. 4 shows the small signal, approximate hybrid-pi model of transistor $Q_{17}$, resistor $R_8$, current gain stage 14, and transistor $Q_{25}$ as connected in the circuit shown in FIG. 2. If output voltages $V_{OUT1}$ and $V_{OUT2}$ are approximated as being equal, the following expressions for $G_M$ and $R_O$ apply:

$$G_M = \frac{-g_{m17}(1 + g_{m25}R_8)}{1 + g_{m17}R_8 + g_{m25}R_8}$$

$$R_o = \frac{r_{o17}(1 + g_{m17}R_8 + g_{m25}R_8)}{1 + g_{m25}R_8 - g_{m17}R_8\frac{r_{o17}}{r_{o25}}}$$

For transistors having substantially identical characteristics (i.e., a matched pair), and operating at substantially the same temperature, it can be shown that the product of $g_m$ and $r_o$ is a constant, independent of operating point. If these conditions are applied to transistors $Q_{17}$ and $Q_{25}$, the terms in the denominator cancel and the expression for $R_o$ can be simplified to:

$$R_o = r_{o17}(1 + g_{m17}R_8 + g_{m25}R_8)$$

The overall gain of the amplifier can thus be expressed as:

$$A_v = G_m R_o = -g_{m17}r_{o17}(1 + g_{m25}R_8)$$

When this expression is compared to the gain expression for the circuit of FIG. 3, it is apparent that the gain of the amplifier is increased by the extra feedback supplied through transistor $Q_{25}$.

It should be noted here that an exact match between devices $Q_{17}$ and $Q_{25}$ is not necessary to increase amplifier performance. However, the increase in gain will be proportional to the degree of match existing between these devices. Thus, design and fabrication of $Q_{17}$ and $Q_{25}$ as a matched pair is desirable. This can be readily accomplished with well known integrated circuit fabrication techniques. It should also be noted that $R_8$ must be greater than zero for a gain improvement to result. If $R_8$ were equal to zero, the feedback current supplied by $Q_{25}$ would flow directly to a signal ground.

Figure 5:
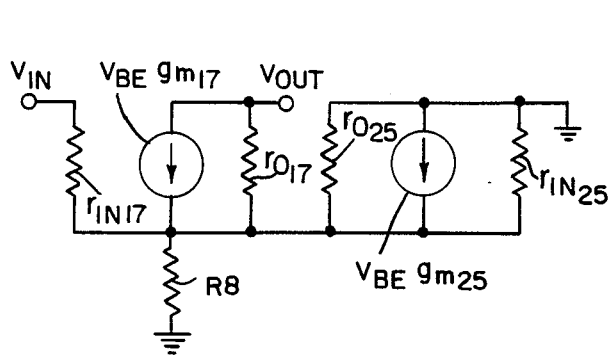
FIG. 5 shows the approximate hybrid-pi equivalent circuit for the same portion of the circuit illustrated in FIG. 4, but with the collector of the feedback transistor connected to the power supply terminal.

To further illustrate the effect of the modification embodied in the circuits of FIGS. 2 and 4, the approximate hybrid-pi equivalent circuit for the same circuit portion is shown in FIG. 5, but with the collector of $Q_{25}$ connected to the positive power supply terminal which is a signal ground. The stage transconductance $G_M$ and the output impedance $R_o$ can be expressed as:

$$G_M = \frac{-g_{m17}(1 + g_{m25}R_8)}{1 + g_{m17}R_8 + g_{m25}R_8}$$

$$R_o = r_{o17}\frac{(1 + g_{m17}R_8 + g_{m25}R_8)}{1 + g_{m25}R_8}$$

The circuit gain is:

$$A_v = G_M R_o = -g_{m17}r_{o17}$$

This configuration is useful because the stage transconductance is increased, resulting in increased amplifier bandwidth and slew rate. However, $R_o$ is correspondingly reduced and the amplifier gain, $A_v$, remains unchanged from that calculated from the equivalent circuit shown in FIG. 3.

Figure 6:
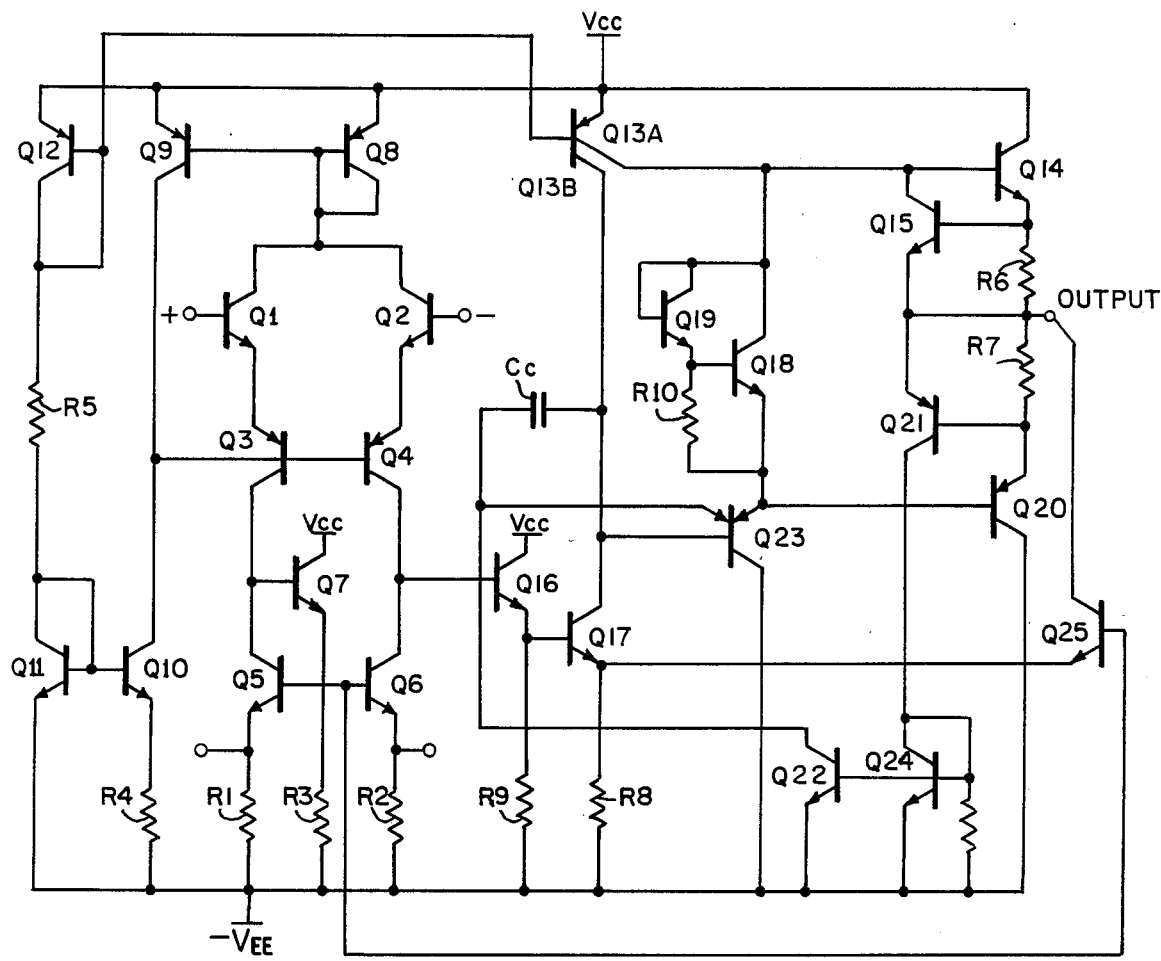
FIG. 6 shows a known operational amplifier circuit modified in accordance with the present invention.

FIG. 6 shows a schematic diagram of the well known 741 operational amplifier circuit modified by the addition of $Q_{25}$. The collector of $Q_{25}$ is connected to the output terminal, the emitter is connected to the emitter of $Q_{17}$, and the base is connected to the emitter of $Q_7$. Connection of the base of $Q_{25}$ to the emitter of $Q_7$ results in a bias voltage on the base of $Q_{25}$ which is approximately equal to the bias voltage present on the base of $Q_{17}$ which is tied to the emitter of transistor $Q_{16}$. Although it is desired that the bias voltages on the base terminals of $Q_{17}$ and $Q_{25}$ be substantially equal, it should be noted that the base terminals should not be connected together. To do so would reduce the stage transconductance $G_m$ and the overall voltage gain. Ideally, the base-emitter voltages of the two transistors should be absolutely equal, but several millivolts mismatch is acceptable. A voltage differential of more than approximately 50 millivolts will result in one transistor supplying virtually all the bias current to $R_8$, causing the other transistor to turn off. If $Q_{25}$ is turned off, there is no feedback and no performance improvement. If $Q_{17}$ is turned off, amplifier operation is disrupted.

Althoughy the specific examples shown and discussed above are NPN bipolar implementations of both the amplifier and feedback modification circuit, it should be readily apparent that analogous circuits can be constructed from PNP bipolar devices. The amplifier and feedback circuit can be implemented in field effect devices as well, with only minor modifications necessary in the above analysis (for example, the mismatch in gate voltages for $Q_{17}$ and $Q_{25}$ will be a function of the device pinch-off voltage and will be higher than 50 millivolts. Thus, it is to be clearly understood that the spirit and scope of this invention are to be limited only by the terms of the appended claims.

What is claimed is:

1. An operational amplifier, comprising:
   a voltage input;
   a voltage gain stage having an input connected to said voltage input, a first voltage output and an output impedance;
   a buffer stage connected between said first voltage output and a second voltage output; and
   feedback means, connected between said second voltage output and said voltage gain stage, for supplying to said voltage gain stage a current which varies in proportion to voltage variations at said first voltage output to effectively increase said output impedance of said voltage gain stage.

2. An operational amplifier according to claim 1, wherein said feedback means includes a feedback device having at least three terminals, including a first terminal connected to said second voltage output, a second terminal connected to said voltage gain stage and a feedback control terminal connected to a control voltage source.

3. An operational amplifier according to claim 2, wherein said feedback device includes a transistor having a collector connected to said first terminal, an emitter connected to said second terminal and a base connected to said control terminal.

4. An operational amplifier comprising:
   a voltage input;
   a voltage gain stage having an input connected to said voltage input, a first voltage output and an output impedance, said voltage gain stage including an output device having at least three terminals, including a first terminal connected to said first voltage output, a second terminal connected by an impedance to a reference potential, and a control terminal connected to a first voltage source;
   a buffer stage connected between said first voltage output and a second voltage output; and
   feedback means, connected between said second voltage output and said second terminal of said voltage gain stage output device, for supplying to said second terminal a current which changes in proportion to voltage changes occurring at said first voltage output to effectively increase said output impedance of said voltage gain stage.

5. An operational amplifier according to claim 4, wherein said feedback means includes a feedback device having at least three terminals, including a first terminal connected to said second voltage output, a second terminal connected to said second terminal of said voltage gain stage output device, and a control terminal connected to a second voltage source.

6. An operational amplifier according to claim 5, wherein said first voltage source and said second voltage source provide voltage levels which are substantially equivalent.

7. An operational amplifier according to claim 5, wherein said voltage gain stage output device and said feedback device are a matched pair.

8. An operational amplifier according to claim 5, wherein said feedback device includes a transistor having a collector connected to said first terminal, an emitter connected to said second terminal and a base connected to said control terminal.

9. An operational amplifier according to claim 8, wherein said voltage gain stage output device includes a transistor having a collector connected to said first terminal, an emitter connected to said second terminal and a base connected to said output control terminal.

10. An operational amplifier according to claim 9, wherein said output device transistor and said feedback device transistor are a matched pair.

11. An operational amplifier, comprising:
    a voltage input;
    a voltage gain stage having an input connected to said voltage input, and having a first voltage output, and having an output transistor connected in a common-emitter configuration, said transistor having a collector connected to a current source and to said first voltage output, an emitter connected by an impedance to a reference potential, and a base connected to a first control voltage;
    a buffer stage connected between said first voltage output and a second voltage output; and
    a feedback device having a first terminal connected to said second voltage output, a second terminal connected to said emitter of said output transistor and a control terminal connected to a second control voltage.

12. An operational amplifier according to claim 11, wherein said feedback device is a transistor having a collector connected to said first terminal, an emitter connected to said second terminal, and a base connected to said second control voltage.

13. An operational amplifier according to claim 12, wherein said transistors are a matched pair.

14. An operational amplifier according to claim 12, wherein said first control voltage is substantially equal to said second control voltage.

15. An operational amplifier, comprising:
    a voltage input;
    a voltage gain stage having an input connected to said voltage input, and having a first voltage output, and having an output transistor connected in a common-source configuration, said transistor having a drain connected to a current source and to said first voltage output, a source connected by an impedance to a reference potential, and a gate connected to a first control voltage;
    a buffer stage connected between said first voltage output and a second voltage output; and
    a feedback device having a first terminal connected to said second voltage output, a second terminal connected to said source of said output transistor and a control terminal connected to a second control voltage.

16. An operational amplifier according to claim 15, wherein said feedback device is a transistor having a drain connected to said first terminal, a source connected to said second terminal, and a gate connected to said second control voltage.

17. An operational amplifier according to claim 16, wherein said transistors are a matched pair.

18. An operational amplifier according to claim 16, wherein said first control voltage is substantially equal to said second control voltage.

* * * * *